United States Patent [19]

Berdahl

[11] Patent Number: 4,746,720

[45] Date of Patent: May 24, 1988

[54] POLYIMIDES AND METHOD FOR MAKING

[75] Inventor: Donald R. Berdahl, Scotia, N.Y.

[73] Assignee: General Electric Company, Schenectady, N.Y.

[21] Appl. No.: 921,035

[22] Filed: Oct. 20, 1986

[51] Int. Cl.$^4$ .................. C08G 8/02; C08G 14/00
[52] U.S. Cl. .................... 528/176; 528/125; 528/126; 528/172; 528/352; 528/185
[58] Field of Search ............ 528/176, 125, 126, 172, 528/352, 353, 185

[56] References Cited

U.S. PATENT DOCUMENTS 3,847,867  11/1974  Heath et al. ............... 528/125
4,550,156  10/1985  Gallagher .................. 528/125

Primary Examiner—Morton Foelak
Assistant Examiner—M. L. Moore
Attorney, Agent, or Firm—William A. Teoli; James C. Davis, Jr.; James Magee, Jr.

[57] ABSTRACT

Solvent resistant polyimides are provided having improved $T_g$ by effecting reaction between aromatic bis(anhydride), such as aromatic bis(etheranhydride), and benzofuran amine such as 2-(4-aminophenyl)-5-benzofuranamine.

10 Claims, No Drawings

POLYIMIDES AND METHOD FOR MAKING

BACKGROUND OF THE INVENTION

Prior to the present invention, as shown by Heath et al., U.S. Pat. No. 3,847,867, assigned to the same assignee as the present invention and incorporated herein by reference, polyetherimides were made by effecting reaction between aromatic bis(etheranhydride) and organic diamine. These polyimides are injection-moldable high performance thermoplastics and useful in a variety of applications. Significant interest has been shown in using polyimides for manufacturing microelectronic circuit boards. Vapor phase soldering, however, has generated a need for inflexible circuit boards capable of withstanding change in shape at temperatures often exceeding the upper limits provided by available injection-moldable thermoplastics.

The present invention is based on the discovery that various aromatic bis(anhydrides), more specifically defined hereinafter, can be intercondensed with aminophenylbenzofuran amines having the formula,

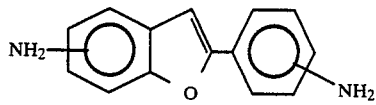
(1)

to provide polyimides having substantially enhanced glass transition temperatures and extremely limited solubility in organic solvents.

STATEMENT OF THE INVENTION

There is provided by the present invention solvent resistant polyimides having a glass transition temperature of at least 230° C. consisting essentially of chemically combined units of the formula,

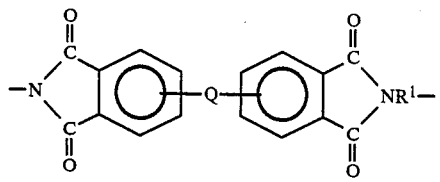
(2)

where Q is a divalent radical selected from —O—, —S—,

and —ORO—, R is selected from $C_{(6-30)}$ divalent aromatic organic radicals, and $R^1$ is

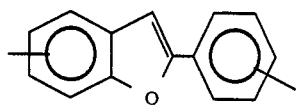
(3)

Some of the radicals included by R of formula (2) are, for example,

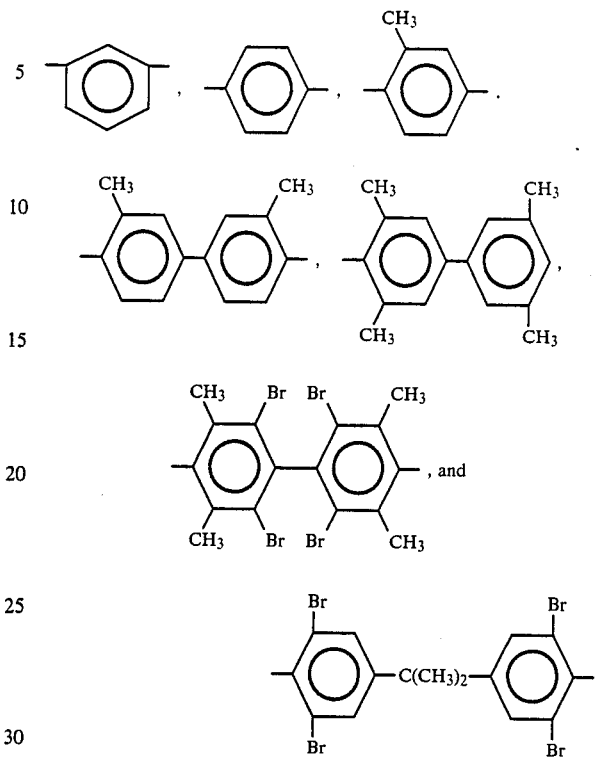

and divalent organic radicals of the general formula

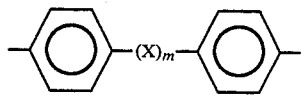

where X is a member selected from the class consisting of divalent radicals of the formulas

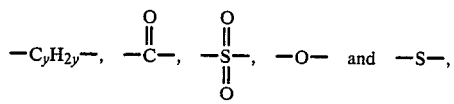

where $M=0$ or 1, and y is a whole number from 1 to 5 inclusive.

Some of the aromatic bis(anhydrides) which can be utilized in the practice of the present invention are included within the following formula:

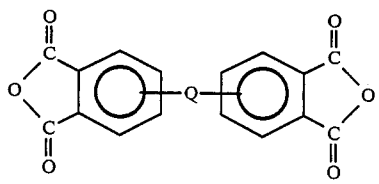
(4)

where Q is as previously defined. Among the preferred aromatic bis(anhydride)s are aromatic bis(etheranhydrides) having the formula,

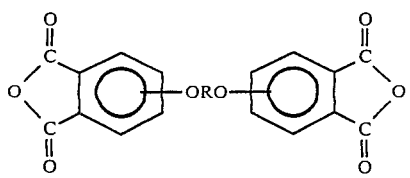

where R is as previously defined.

There are included within formula (1), aminophenylbenzofuran amines such as,

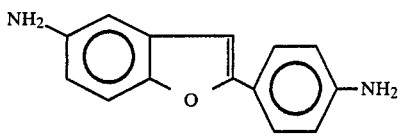

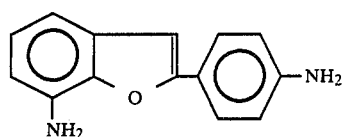

Methods for making the aminophenylbenzofuran amines of formula (1) are shown by O. Dann et al., Liebigs Ann. Chem. 1836–1869 (1982) and H. Inoue et al., Kogyo Kagakie Zasshi 73, 187–194 (1970) as reported in Chem. Abstracts 73, 26586C (1970).

In addition to the aminophenylbenzofuran amines of formula (1), there also can be utilized up to 50 mol percent of other aromatic organic diamines in combination with the benzofuran amines based on the total mols of the benzofuran amines and the organic diamines. Some of these alternative organic diamines are, for example,

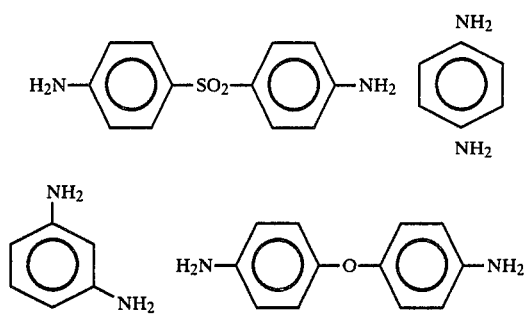

There is also included within the practice of the present invention, a method for making a polyimide consisting essentially of chemically combined units of formula (2) which comprises, (1) effecting reaction in the presence of organic solvent between substantially equal molar amounts of aromatic bis(anhydride) of formula (4) and benzofuran amine of formula (1) or a mixture thereof, having up to 50 mol percent of other organic diamines as previously defined, and (2) recovering polyimide from the mixture of (1) where Q and $R^1$ are as previously defined.

In the practice of the method of the present invention, reaction is effected in accordance with a procedure similar to Heath et al. U.S. Pat. No. 3,847,867 (ambient temperature) between substantially equal molar amounts of the aromatic bis(anhydride) of formula (4) and the benzofuran amide, of formula (1) or a mixture of such benzofuran amine having up to 50 mol percent of organic diamine as previously defined in the presence of an organic solvent to produce a solution of an intermediate polyamic acid. A chain stopper such as phthalic anhydride can be used to control molecular weight. The polyamic acid will be useful for preparing high $T_g$ composite structures with carbon fibers, or glass fibers.

The polyamic acid solution can be applied onto a substrate with a spatula or curtain coater and the resulting applied polyamic acid can be heated to convert the polyamic acid to the polyimide state. Suitable organic solvents which can be utilized in making the polyamic acid solution are, for example, dipolar aprotic solvents such as dimethylformamide, dimethylacetamide, and N-methylpyrrolidone. Temperatures which can be used to prepare the polyamic acid are, for example, from room temperature to 60° C. Conversion of the polyamic acid to the polyimide state can be achieved at temperatures in the range of from 300° C. to 350° C.

The polyamic acid solutions made in accordance with the practice of the invention can be reinforced with carbon fibers, glass fibers and the like to make composite structures exhibiting high $T_g$'s and solvent resistance when converted to the polyimide state.

In order that those skilled in the art will be better able to practice the present invention, the following example is given by way of illustration and not by way of limitation. All parts are by weight.

EXAMPLE

A mixture of 19.35 grams (0.116 mol) of 5-nitrosalicyaldehyde, 25.01 grams (0.116 mol) of 4-nitrobenzyl bromide, 16 grams (0.116 mol) of anhydrous potassium carbonate, and 80 ml of dimethylformamide was stirred under a nitrogen atmosphere at room temperature for 12 hours. The mixture, containing a yellow precipitate, was poured into 700 ml of water and filtered. Recrystallization of the solid from glacial acetic acid provided 31.32 grams or an 89.3% yield of 2-(4-nitrobenzyloxy)-5-nitrobenzaldehyde as yellow needles having a melting point of 210°–212° C.

A mixture of 30.22 grams (0.1 mol) of 2-(4-nitrobenzyloxy)-5-nitrobenzaldehyde, 100 ml of dimethylformamide, and 7.3 grams (0.11 mol) of potassium hydroxide was stirred for 12 hours at room temperature under nitrogen. The resulting dark brown suspension was poured into 500 ml of ice water. An orange precipitate resulted which was recovered by filtration and recrystallized twice from acetic acid. There was obtained 20.6 grams of a 72% yield of dinitrobenzofuran having a melting point of 281°–283° C.

A mixture of 4 grams (14.1 mmol) of 5-nitro-2-(4-nitrophenyl)benzofuran, 0.5 gram of 10% palladium on charcoal, and 60 mL of tetrahydrofuran was hydrogenated for 7 hours at 50 psi while being agitated in a Parr-shaker apparatus. The resulting solution was then filtered through glass microfiber filter paper and evaporated. The resulting orange residue was sublimed (170° C., 0.1 torr) and then recrystallized in acetic acid yielding 2.2 grams or a 69.6% yield of 2-(4-aminophenyl)-5-benzofuranamine having a melting point of 198°–200° C.

A mixture of 0.2669 grams (0.861 mmol) of 4,4′-oxydiphthalic anhydride, 0.1970 grams (0.878 mmol) of 2-(4-aminophenyl)-5-benzofuranamine, 0.0052 grams (0.035 mmol) of phthalic anhydride, and 2 mL of dried dimethylacetamide was agitated under sealed conditions for about 12 hours. The resulting viscous solution was coated onto the glass plates using a 4 mil film applicator. The plates were heated in a programmable oven in air. There was utilized an initial temperature of 23° C. for one minute, followed by a temperature increase at 25° per minute to 330° C. and thereafter held for 70 minutes. The resulting product was then allowed to cool to room temperature over approximately 30 minutes. The films were removed from the glass plates by immersion in boiling water for a few minutes. Based on method of preparation, the product was a polyetherimide consisting essentially of chemically combined units of the formula:

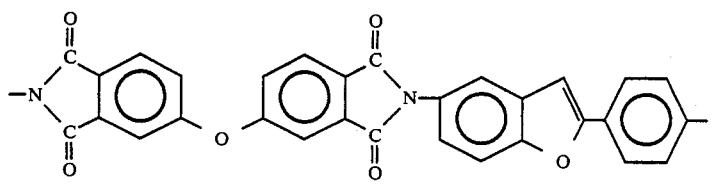

The above films were found to be tough and had a $T_g$ of 347° C.

The above procedure was repeated, except that in place of 4,4-oxydiphthalic anhydride (ODAN) there was substituted BPADA having the formula:

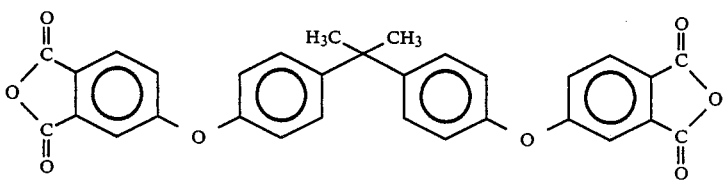

SDA having the formula:

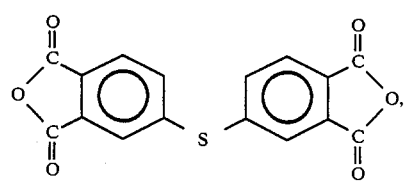

BTDA having the formula:

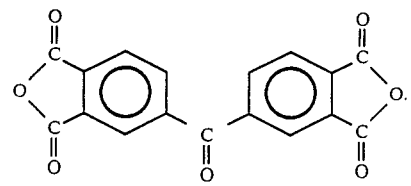

The various polyimides were evaluated for thermal stability and solubility along with polyetherimide made by the melt polymerization of BPADA and meta-phenylene diamine as shown by Schmidt et al., U.S. Pat. No. 4,443,591, assigned to the same assignee as the present invention incorporated herein by reference. The following results were obtained where "N.O." indicates "not observed"; + means fully soluble, − means totally insoluble, and ± means polymer swells:

| Thermal and Solubility Data of Polyimides Prepared from 2-(4-Aminophenyl)-5-benzofuranamine | | | | | | |
|---|---|---|---|---|---|---|
| Dianhydride[4] | $T_g$ (°C.) | TGA($N_2$) (°C.) onset | $CH_2Cl_2$ | m-Cresol (hot) | o-DCB (hot) | NMP (hot) |
| 1. BPADA | 252 | 482 | − | ± | − | ± |
| 2. ODAN | 347 | 586 | − | − | − | ± |
| 3. SDA | 338 | 508 | − | − | − | ± |
| 4. BTDA | N.O. | N.O. | − | − | − | − |
| 5. BPADA* | 217 | 540 | + | + | + | + |

*melt polymerized with m-phenylene diamine

The above results show that the $T_g$'s of the polyimides made in accordance with the practice of the present invention are substantially higher than the $T_g$ of prior art polyetherimides using BPADA and meta-phenylene diamine in accordance with the method of Schmidt et al. U.S. Pat. No. 4,443,591. It was further found that the $T_g$'s of polyimides using m-phenylene diamine with the other dianhydrides shown above had $T_g$'s substantially lower than the $T_g$'s shown in the above Table made in accordance with the practice of the invention.

Although the above examples are directed to only a few of the very many variables which can be used in the practice of the method of the present invention, it should be understood that the present invention is directed to the use of a much broader variety of aromatic bis(ether anhydrides) of formula (4), an aminophenylbenzofurandimines of formula (1) to produce a wide variety of solvent-resistant polyimides having superior glass transition temperatures.

What is claimed and sought to be protected by Letters Patent of the United States is as follows:

1. A solvent resistant polyimide having a glass transition temperature of at least 230° C. consisting essentially of chemically combined units of the formula,

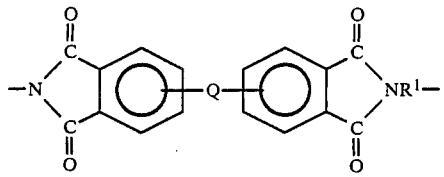

where Q is a divalent radical selected from —O—, —S—,

and —ORO—, R is selected from $C_{(6-30)}$ divalent aromatic organic radicals, and $R^1$ is

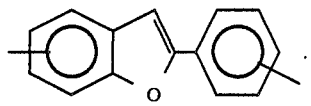

2. A solvent resistant polyetherimide in accordance with claim 1, where Q is

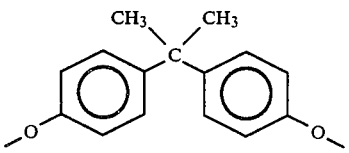

3. A solvent resistant polyimide in accordance with claim 1, where Q is —O—.

4. A solvent resistant polyetherimide in accordance with claim 1, where $R^1$ is

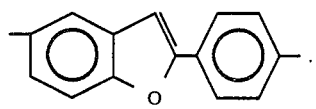

5. A solvent resistant polyimide in accordance with claim 1, where Q is

6. A solvent resistant polyimide in accordance with claim 1, where Q is —S—.

7. A method for making polyimide consisting essentially of chemically combined units of the formula,

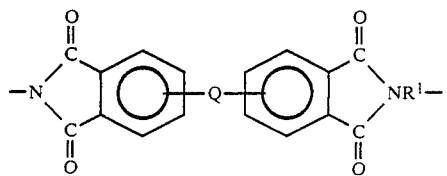

which comprises
(1) effecting reaction in the presence of organic solvent between substantially equal molar amounts of aromatic bis(anhydride) of the formula,

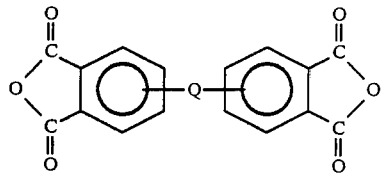

and benzofuran amine of the formula,

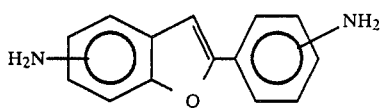

or a mixture thereof, with an organic diamine selected from the class consisting of

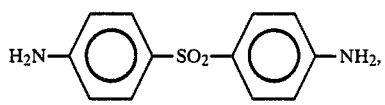

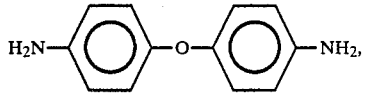

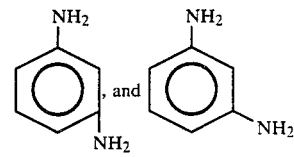

and
(2) recovering polyimide from the mixture of (1) where Q is a divalent radical selected from —O—, —S—,

and —ORO—, R is selected from $C_{(6-30)}$ divalent aromatic organic radicals, and $R^1$ is

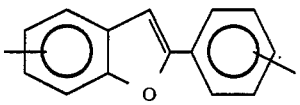

8. A method in accordance with claim 7, where the aromatic bis(anhydride) is an aromatic bis(etheranhydride).

9. A method in accordance with claim 8, where the aromatic bis(etheranhydride) is 2,2-bis[4-(3,4-dicarboxyphenoxy)phenyl]propane dianhydride.

10. A method in accordance with claim 7, where the benzofuran amine is 2-(4-aminophenyl)-5-benzofuran amine.

* * * * *